United States Patent [19]

Schmitt et al.

[11] Patent Number: 4,763,068

[45] Date of Patent: Aug. 9, 1988

[54] METHOD, CIRCUIT AND APPARATUS FOR THE ELIMINATION OF THE D.C. VOLTAGE COMPONENTS OF A CAPACITIVE A.C. VOLTAGE DIVIDER

[75] Inventors: Robert Schmitt, Bamberg; Peter Steffens, Stegaurach, both of Fed. Rep. of Germany

[73] Assignee: MWB Messwandler-Bau Aktiengesellschaft, Bamberg, Fed. Rep. of Germany

[21] Appl. No.: 822,312

[22] Filed: Jan. 24, 1986

[30] Foreign Application Priority Data

Jan. 26, 1985 [DE] Fed. Rep. of Germany ....... 3502638

[51] Int. Cl.⁴ .......................................... G01R 19/25
[52] U.S. Cl. ..................................... 324/126; 324/130
[58] Field of Search ............... 324/102, 126, 127, 130; 328/162, 163, 165; 307/358; 330/9

[56] References Cited

U.S. PATENT DOCUMENTS

| | | | |
|---|---|---|---|
| 3,206,686 | 9/1965 | Goor | 328/163 |
| 3,605,012 | 9/1971 | Kubanoff | 328/165 |
| 3,622,894 | 11/1971 | Heidecker | 328/163 |
| 3,800,236 | 3/1974 | Riethmuller et al. | 328/162 |
| 3,940,759 | 2/1976 | Zitelli et al. | 330/9 |
| 4,063,447 | 12/1977 | Mathison | 324/130 |
| 4,193,039 | 3/1980 | Massa et al. | 328/162 |
| 4,229,703 | 10/1980 | Bustin | 330/9 |
| 4,327,390 | 4/1982 | Despiney | 324/126 |
| 4,406,988 | 9/1983 | Scholz | 307/358 |
| 4,500,837 | 2/1985 | Shuey et al. | 324/102 |
| 4,528,678 | 8/1985 | Udren | 328/165 |
| 4,607,278 | 8/1986 | Flanam | 328/165 |
| 4,641,324 | 2/1987 | Karsh et al. | 307/358 |

FOREIGN PATENT DOCUMENTS 2634595 3/1977 Fed. Rep. of Germany .
2846285 4/1979 Fed. Rep. of Germany .
0171109 10/1983 Japan ....................... 330/9

OTHER PUBLICATIONS

"The Transient Recorder", by Cargile et al., Research Development 1/73, vol. 24, #1, pp. 32-35.

Primary Examiner—Reinhard J. Eisenzopf
Assistant Examiner—W. Burns
Attorney, Agent, or Firm—Barnes & Thornburg

[57] ABSTRACT

In a method for the elimination of the d.c. voltage components of a capacitive a.c. voltage divider whose a.c. measuring voltage which may include a d.c. voltage component, is fed to a measurement transformer, the task is to be solved to remove as quickly as possible the d.c. voltage component of the a.c. measuring voltage also to the greatest extent possible without falsification of the reproduction of the middle or high voltage to be measured. This is achieved in that the a.c. measuring voltage ($U_M$) is fed to a measuring amplifier (14) by way of two parallel lines (L1, L2) via a d.c. voltage blocking element (6). The a.c. measuring voltage ($U_M$) is thereby fed directly by way of one line (L1) and the d.c. voltage component ($U_G$) of the a.c. measuring voltage ($U_M$) is determined in the other line (L2) in that the a.c. measuring voltage ($U_M$) is subdivided into such small time sections (t) that an equal number of time sections is coordinated per cycle (T) or half cycle (T/2) and the a.c. measuring voltage is continuously integrated over a period (T) at the frequency (Tf) of the time sections (t). The thus-determined respective d.c. voltage value ($U_G$) is fed to the measuring amplifier (14) in phase opposition to the original value and by way of the latter to the measurement transformer (16) (FIG. 1).

19 Claims, 3 Drawing Sheets

METHOD, CIRCUIT AND APPARATUS FOR THE ELIMINATION OF THE D.C. VOLTAGE COMPONENTS OF A CAPACITIVE A.C. VOLTAGE DIVIDER

BACKGROUND AND SUMMARY OF THE INVENTION

The present invention relates to a method for the elimination of the d.c. voltage components of a capacitive a.c. voltage divider, especially for middle and high voltages, as well as to a circuit for carrying out this method and to an apparatus with such a circuit.

Such a method, respectively, such an arrangement are described already in the DE-OS No. 26 34 595. The series circuit of a switch with a very low ohmic resistance is connected in this prior art arrangement as switching device in parallel to the condenser of a capacitive voltage divider connected to ground, and additionally a control device is connected in parallel thereto. The control device opens the switch after the reconnection of the a.c. voltage in dependence of the first passage through zero after a delay time of about one millisecond. Under normal operating conditions, the normal operating condition is reached thereby no later than a half cycle after the reconnection to the line and the input is short-circuited during this period of time.

However, the measurement of high voltages takes place at present for the most part by means of inductive voltage measuring transformers. The higher the voltage level, the more expensive become these installations.

Consequently, attempts were made in the past every so often to carry out the high voltage measurement by means of capacitive high voltage dividers and following measurement amplifier.

The occurrence of d.c. voltage terms in the capacitive divider thereby represents a problem. These d.c. voltages occur when the divider which is under high voltage, is disconnected at an instant in which the voltage is not equal to zero. A d.c. voltage then remains at the amplifier input. Even if this d.c. voltage is reduced by way of the input resistance of the amplifier, the charge which is stored in the high-end voltage condenser, occurs as d.c. voltage component during the reconnection of the high voltage, which d.c. voltage component is subadjacent to the a.c. voltage. This displaces the zero passages of the output voltage which are important for protective installations and with potential-free or floating transformer outputs leads to the saturation thereof.

In improving the aforementioned arrangement, a circuit is proposed in the DE-OS No. 28 46 285 in which the discharge impedance is interconnected in case of a determination of d.c. voltage components and is again disconnected after some cycles which causes the disadvantages described above only during a shorter period of time.

A second high voltage divider is provided in this literature which feeds a second amplifier input blocking a d.c. voltage, and dividers were proposed which include several measuring or control condensers in order to differently process different input voltages and to make logic decisions which alternately connect and disconnect for several half cycles an element of variable impedance at the measurement input in the sense of the d.c. voltage until the d.c. voltage has decayed.

The element with variable impedance is in the most simple case a resistance, and a switch arranged in series therewith. However, it may also be a semi-conductor controllable in its resistance or a register of switches with the same or different resistances as are known in connection with digital-analog converters.

Furthermore, amplifiers with purely electronic filters were made which filter the d.c. voltage components out of the measurement signal. However, it is thereby very difficult to bring about an acceptable compromise in the present-day requirements for accuracy in amplitude and phase, in the frequency response and the transient behavior. Furthermore, such an arrangement is difficult to monitor for its operating reliability—as takes place customarily with the so-called longitudinal differentiation—because the output voltage is not equal to the input voltage for a transition period of time.

Present-day rapid protective installations require already after milliseconds amplifier output voltages which are a good image of the high voltage and which contain no shifts or displacements leading to error or faulty switchings.

This task leads to the solutions known in the prior art according to the DE-OS No. 28 46 285 and the DE-OS No. 26 34 595. The basic concept of the DE-OS No. 26 34 595 is—in contrast to the subject matter according to the DE-OS No. 28 46 285—that the d.c. voltage component is not removed gradually in several steps but is removed totally from the simple high voltage divider in a short period of time and instantaneously at the earliest possible instant.

A falsification of the a.c. voltage to be measured always occurs with these prior art short-circuit arrangements in the middle and high voltage range.

In contrast thereto, the underlying problems are to be solved by the present invention to remove the d.c. voltage component of the a.c. measuring voltage as rapidly as possible and to the greatest possible extent without falsification of the reproduction of the middle or high voltage to be measured. Large, costly components such as, for example, inductive voltage converters, short-circuit switches or the like are thereby to be avoided.

The underlying problems are solved according to the present invention in that the a.c. measuring voltage is fed to a measuring amplifier by way of a condenser and by way of two parallel lines whereby the a.c. measuring voltage is fed directly by way of one line and the d.c. voltage component of the a.c. measuring voltage is determined in the other line in that the a.c. measuring voltage is divided into such small time section that an equal number of time sections is coordinated to each cycle or half cycle and the a.c. measuring voltage is continuously integrated over one cycle at the frequency of the time sections and the thus-determined respective d.c. voltage value is fed in phase opposition to the original value to the measuring amplifier and by way of the latter to the measurement transformer.

By digitalizing the a.c. measuring voltage in a parallel branch of the amplifier and by the integration of the d.c. voltage component obtained over a cycle of the a.c. measurement voltage and the inverted input thereof into the measurement amplifier, any influence on the a.c. measurement voltage is completely avoided and additionally the d.c. voltage component is completely compensated in a very short period of time. By the integration over a cycle, additionally higher frequency interference or noise voltages are eliminated so that actually only the pure d.c. voltage component is obtained and an accurate compensation is made possible thereby.

The same end result is obtained if the a.c. measuring voltage is digitalized in a parallel branch and forms the average value from several time sections of a half cycle and compares the same with the average value formed a half cycle earlier and feeds the obtained voltage difference inverted to the measuring amplifier. One obtains thereby a compensation already at an earlier point in time.

These and other objects, features and advantages of the present invention will become more apparent from the following description when taken in connection with the accompanying drawing which shows, for purposes of illustration only, two embodiments in accordance with the present invention, and wherein:

DETAILED DESCRIPTION OF THE DRAWINGS

Figure 1:
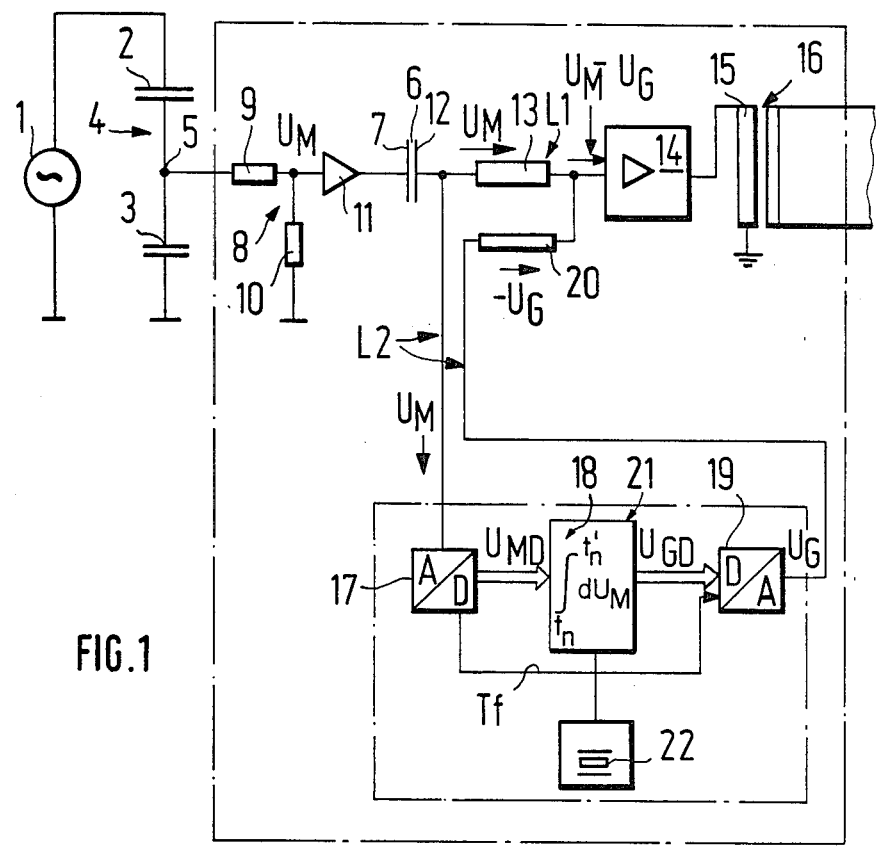
FIG. 1 is a circuit diagram in principle of one embodiment in accordance with the present invention.

Referring now to the drawing, and more particularly to FIG. 1, a capacitive voltage divider 4 formed of the high-end voltage condenser 2 and of the low-end voltage condenser 3 is connected to an a.c. voltage network 1. An isolating capacitor 6 is connected with its electrode 7 to the connecting point 5 of the capacitive voltage divider 4. Preferably a voltage divider 8, especially of ohmic impedances 9 and 10 is connected between the isolating condenser 6 and the connecting point 5. The voltage divider 8 serves to reduce the a.c. measuring value $U_M$ to values which are not harmful for the following components such as integrated semi-conductor circuits (IC's) i.e., for example, to 5 V. Possibly an amplifier 11 may be provided especially for accentuating or emphasizing the a.c. measuring voltage $U_M$ with respect to noise signals or interference voltages.

The other electrode 12 of the isolating condenser 6 is connected directly with a measuring amplifier 14 by means of a line L1, for example, by way of a resistance 13; the terminals of the primary winding 15 of the measurement transformer 16 are connected to the output of the measuring amplifier 14. According to a first embodiment of the present invention, the series circuit of an analog-digital converter 17 with a digital integrator 18 and with a digital-analog converter 19 as well as possibly with a resistance 20 is connected in the line L2 in parallel with the resistance 13. A microprocessor 21 serves to control the components 17, 18, 19 by way of an internal clock generator 22 and for the control with respect to time of the digital integrator 18 as well as possibly also for the delay of the measured values relative to the a.c. measuring voltage $U_M$. A microprocessor is thereby favorably used which contains already the components such as, for example, RAMs and/or ROMs, by means of which an analog-digital converter, a digital integrator and a digital-analog converter can be realized. The realization then takes place by corresponding programming of the microprocessor. The control takes place by the integrated clock generator.

The operation of this circuit and the sequence of the d.c. voltage compensation of the d.c. voltage component $U_G$ contained in the a.c. measuring voltage $U_M$ by integration takes place as follows:

The a.c. measuring voltage $U_M$ which is present at the isolating condenser 6 at the electrode 12 thereof, is fed directly to the measuring amplifier 14 by way of the resistance 13. At the same time, the a.c. measuring voltage $U_M$ reaches the analog digital converter 17. The latter is controlled by the clock generator 22 at such a clock frequency that it subdivides the cycle duration T of the network frequency of the a.c. voltage network 1 into a large number of time sections t and for each time section t, produces the associated voltage value, especially in digital form, for example, in a four-, eight- or sixteen-bit sample. This value is fed to the integrator 18.

Figure 2:
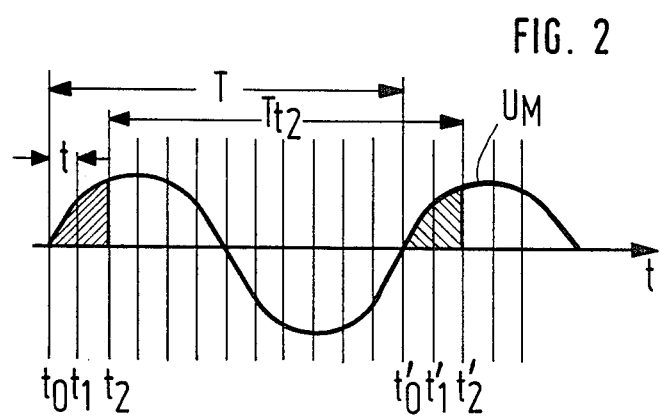
FIG. 2 is a digitalized measuring voltage curve.

The latter is controlled with the same clock frequency Tf and at the same time in such a manner that it always integrates at the frequency of the clock pulses over a cycle duration T and produces the respective integrated value. This operation is illustrated more fully in FIG. 2. As can be seen, the cycle duration T is subdivided into time sections t. The integrator 18 forms always the integral over the cycle duration T, i.e., for example, from the instant of time $t_0$ to $t_0'$. Without a d.c. voltage component, the integrated value at the time instant $t_0'$ is therefore equal to zero. Similarly, for example, it is at the instant of time $t2'=0$ because the integral value from $t_0$ to $t_2$ is eliminated over the cycle duration $T_{t2}$ (fine cross-hatched area) whereas that from $t_o$ to $t_2'$ is added (coarsely cross-hatched area). In this manner, every d.c. voltage component occurring in a time section t can be determined immediately. The d.c. voltage value $U_{GD}$ which is eventually present in digital form, is fed to the D/A converter 19 which produces in its output the analog d.c. voltage $U_G$. The latter is inverted either directly in the D/A converter 19 or in an inverter connected in the output thereof and is thus fed to the measuring amplifier 14 in opposite phase to the eventually present d.c. voltage component in the a.c. measuring voltage $U_M$, which thus receives the pure a.c. measuring value.

Possibly the a.c. measuring voltage $U_M$ or the d.c. voltage component $U_G$, respectively $-U_G$ is so delayed by a delay device, for example, by a corresponding programming of the microprocessor 21 that at the input of the measuring amplifier 14 the d.c. voltage component of a time section t corresponds to the same time section of the a.c. measuring voltage $U_M$ at the input of the measuring amplifier 14, i.e., both are in phase. Possibly the delay can be so selected that the two are mutually displaced up to a few cycles T whereas the time sections t correspond to one another.

In one example, with a network frequency of 50 Hz, one cycle has the time duration of 20 ms, i.e., T=20 ms. The latter forms the integration interval. For the input magnitude x(t) and the output value y(t), the following equation then applies:

$$y(t) = \int_{t-20\text{ ms}}^{t} x(t)dt$$

It is furthermore assumed that one cycle duration T is subdivided into 256 time sections t. The integral is then formed numerically according to the following recursive difference equation:

$$y(n) = y(n-1) + x(n) - x(n-256),$$

i.e., the actual integral is calculated from the integral obtained from one cycle T earlier plus the instantaneous detected value at the time $T_n$ minus the detected value (n−256), i.e., 20 ms before. This has as a consequence that after one cycle duration T=20 ms after the application of the network voltage (at 50 Hz) the exact d.c. voltage component is known and is available for compensation.

Figure 3:
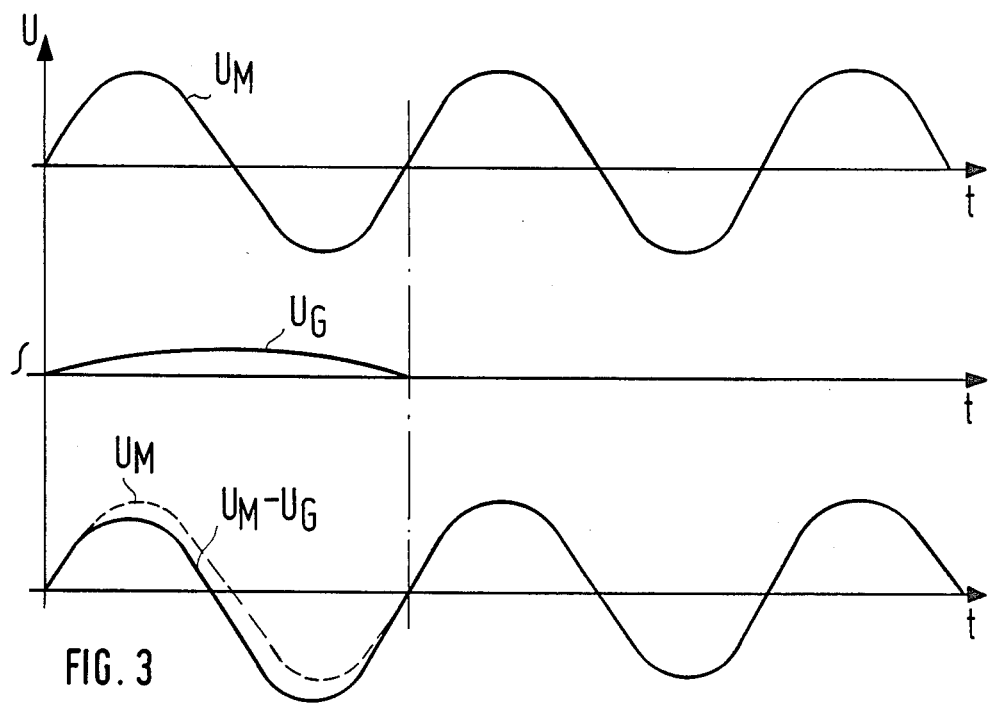
FIG. 3 is a diagram illustrating the operation with the engagement in the zero passage in the absence of a d.c. voltage component.

With the assumed connecting instant of time in the zero passage and with an increasing voltage as illustrated in FIG. 3, one obtains without a d.c. voltage component in the a.c. measuring voltage $U_M$ by integration of this first cycle an integration curve which simulates in this first cycle a d.c. voltage component $U_G$. However, this d.c. voltage component only occurs during the first cycle and effects in the most unfavorable case a slight shifting of the a.c. measuring voltage $U_M$ by ½ of the input amplitude. However, with the beginning of the second cycle, this deviation is eliminated.

Figure 4:
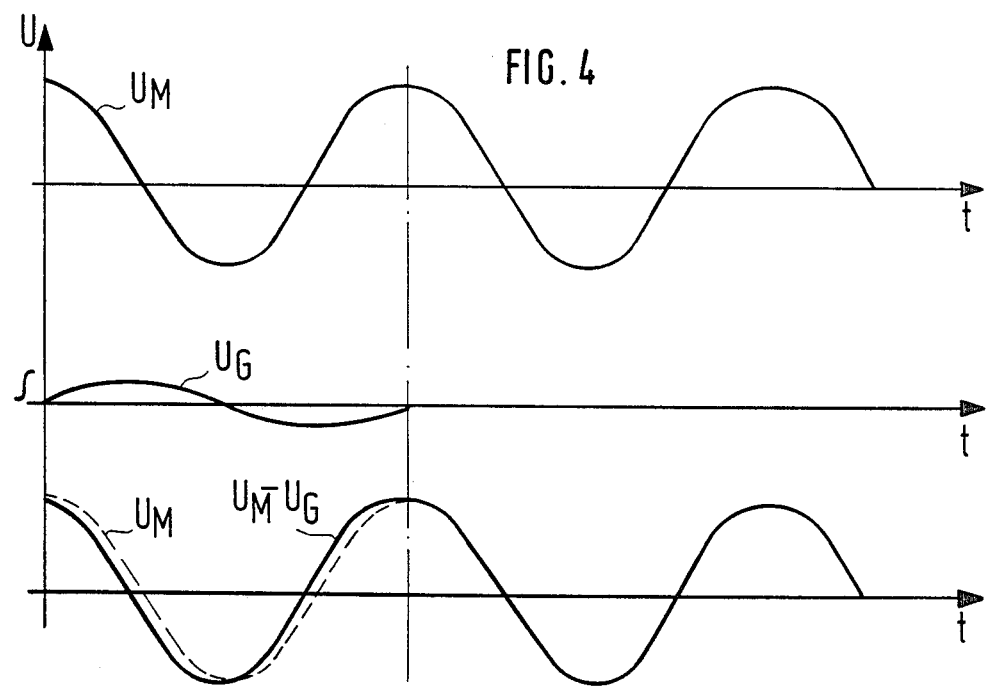
FIG. 4 is a diagram illustrating the operation with the engagement in the peak point in the absence of a d.c. voltage component.

FIG. 4 illustrates a corresponding change of the a.c. measuring voltage $U_M$ which does not include a d.c. voltage component, during the connection at the peak point of the positive half wave. As can be seen, the a.c. measuring voltage is thereby considerably less distorted.

Figure 5:
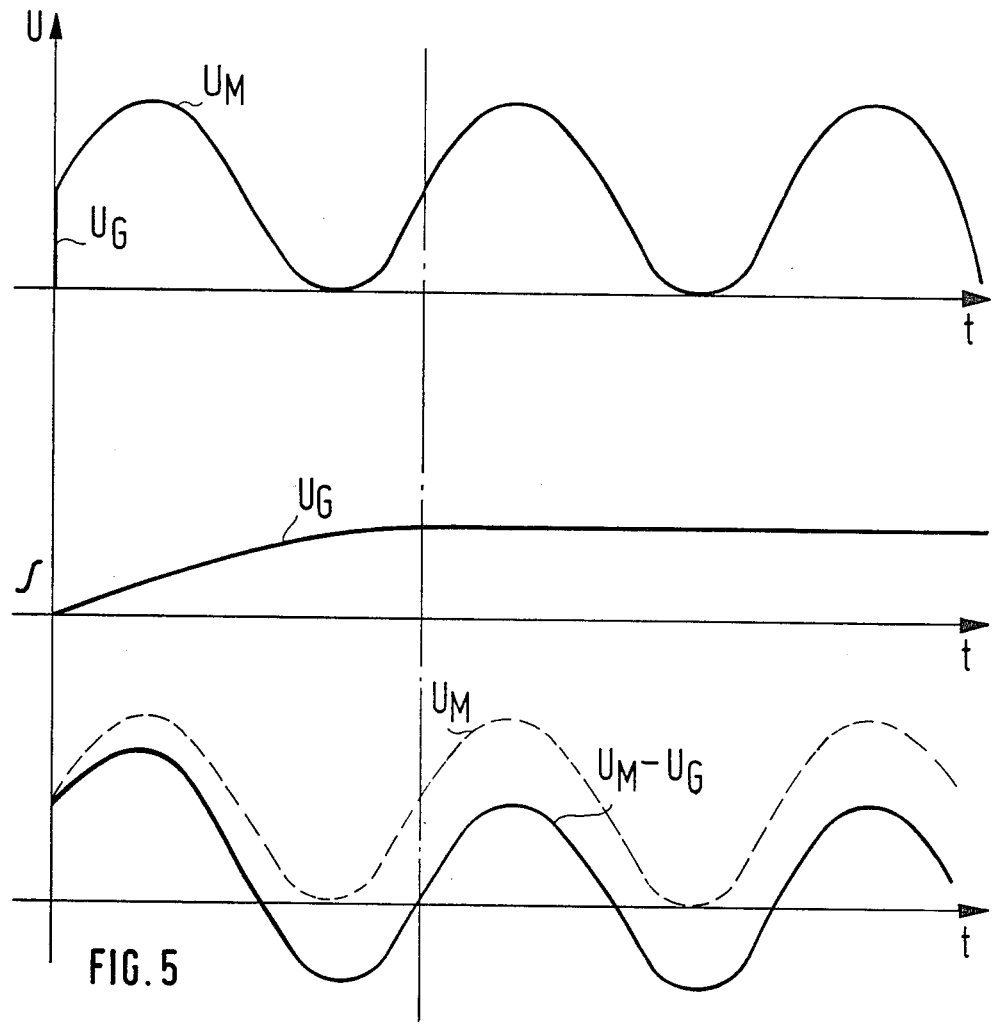
FIG. 5 is a diagram illustrating the operation with the engagement in the zero passage in the presence of a d.c. voltage component.

Finally, the compensation of a d.c. voltage component $U_G$ of the a.c. measuring voltage $U_M$ is illustrated in FIG. 5 with connection in the zero passage of the a.c. voltage component and with a positive d.c. voltage component at the level of the peak value of the a.c. measuring voltage. It can be seen that after one cycle T, the d.c. voltage component is fully compensated and the pure a.c. voltage is therefore available for the measurement so that neither a saturation of the measurement transformer core nor a distortion by a unilateral core premagnetization by reason of a d.c. voltage component occurs in the measurement transformer.

The method according to the present invention, the associated circuit and the apparatus for the elimination of the d.c. voltage components are suitable for use in all types of a.c. voltage networks even though the preferred field of application are middle and high voltage networks.

Figure 6:
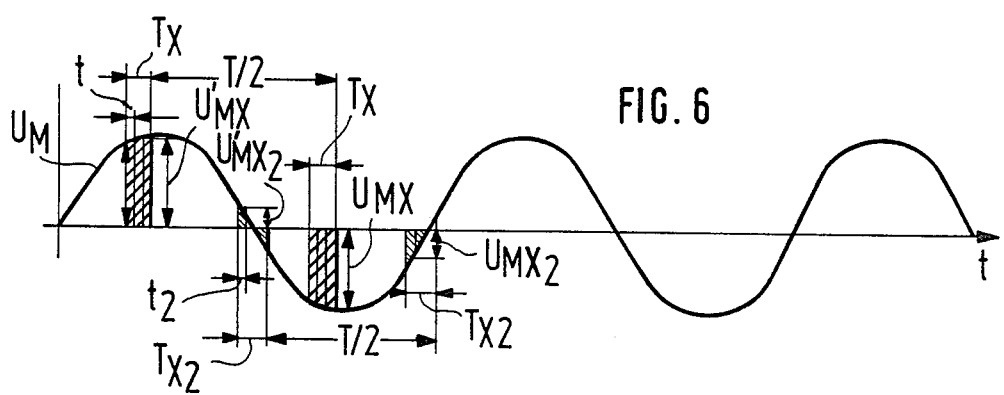
FIG. 6 is a diagram illustrating the operation with a half cycle time section comparison.

In the embodiment in accordance with the present invention illustrated in FIG. 6, the cycles or half cycles are also subdivided into equal time sections t. However, in this case only a partial section Tx is measured during a half cycle T/2 which includes at least three successively following time sections t. The voltage average value $U_{Mx}$ is formed from the individual instantaneous values $U_t$ of the a.c. measuring voltage $U_M$, for example, by the addition of the instantaneous values $U_t$ and the division by the number of the utilized time sections t. By the use of several time sections t for the average value formation, voltage peaks or voltage collapses which occur do not appear fully in the measurement result, but the same are compensated.

The respective average voltage value $U_{Mx}$ of a time section Tx is compared in each case with the average voltage value $U_{Mx}'$ determined one half cycle T/2 earlier and the obtained voltage is fed inverted to the measuring amplifier 14. In this manner already after one half cycle T/2 a complete compensation of an existing d.c. voltage component is achieved in the a.c. measuring voltage $U_M$. A compensation takes place also in this case after each time section t.

Two measuring phases are illustrated in FIG. 6 whereby the first is cross-hatched coarsely from the left bottom toward the right top and the second is finely cross-hatched from the left top toward the right bottom and for the better differentiation, the latter is provided with the index 2.

The operation is essentially the same as in the first embodiment, only in this embodiment of FIG. 6, the average values are compared and, more particularly, already after a half cycle T/2. The circuit can thereby also be the same, only that in lieu of the integration an average value formation takes place. Both possibilities can be effected by a corresponding programming of the microprocessor 21, respectively, of the coordinated component or, for example, integrated with the microprocessor.

It should also be mentioned that according to the present invention at the instant of time of the connection, a comparison with the reference voltage zero is undertaken over a cycle duration with application of the integration, respectively, over a half cycle T/2 with the average value formation. A d.c. voltage compensation is obtained thereby from this instant which also brings about that the measurement transformer of the measuring circuit does not reach saturation.

While we have shown and described two embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A method for elimination of d.c. voltage components of a capacitive a.c. voltage divider, especially for middle and high voltages, whose a.c. measuring voltage, which may include a d.c. voltage component, is fed to a measurement transformer, comprising the steps of feeding the a.c. measuring voltage by way of a condenser to a measuring amplifier via two parallel lines, the a.c. measuring voltage being fed to the measuring amplifier directly by way of one line, determining in another line the d.c. voltage component of the a.c. measuring voltage by subdividing the a.c. measuring voltage by an analog-digital converter into small time sections such that an equal number of time sections is coordinated to each cycle or half cycle, continuously integrating at a frequency of the time sections the a.c. measuring voltage over a period of time, and feeding the thus determined, respective d.c. voltage values in opposite phase to said d.c. voltage component to the measuring amplifier and by way of said measuring amplifier to the measurement transformer.

2. A method for elimination of d.c. voltage components of a capacitive voltage divider, especially for middle and high voltages, whose a.c. measuring voltage which may include a d.c. voltage component, is fed to a measurement transformer, comprising the steps of feeding the a.c. measuring voltage by way of a condenser to a measuring amplifier via two parallel lines, the a.c. measuring voltage being fed directly by way of a first line, determining in the other line the d.c. voltage component of the a.c. measuring voltage by subdividing the a.c. measuring voltage into such small time sections that an equal number of time sections is coordinated to each half period, continuously forming at a frequency of the time sections from the instantaneous values of at least two successive time sections forming a partial interval of a half cycle, an average voltage value, comparing the average voltage value with a respective average voltage value of the time sections which are one half cycle earlier, and determining therefrom the voltage difference and feeding the same inverted to the measuring amplifier.

3. A method according to claim 2, wherein at least three consecutive time sections are used for the average voltage value formation.

4. A method according to claim 1, further comprising the steps of undertaking the subdivision of the a.c. measuring voltage into time sections by a clock-controlled analog-digital converter controlled by a clock generator, feeding digital information to a digital integrator controlled by clock pulses also controlling said analog-digital converter, feeding in this clock sequence over one a.c. voltage cycle the respective digital values of one cycle, determined by the digital integrator, to a digital-analog converter also controlled by the same clock generator, producing in the digital-analog converter from the digital value a d.c. voltage, and feeding the d.c. voltage to the measuring amplifier in opposite phase to a value actually present in the a.c. measuring voltage.

5. A method according to claim 4, wherein the a.c. measuring voltage in at least one of the two parallel lines is delayed in such a manner that a phase position of the voltage fed to the measuring amplifier is displaced exactly by one or several cycles with respect to the a.c. measuring voltage.

6. A method according to claim 5, further comprising the step of utilizing a microprocessor for forming algorithms.

7. A method according to claim 1, wherein the a.c. measuring voltage in at least one of the two parallel lines is delayed in such a manner that a phase position of the voltage fed to the measuring amplifier is displaced exactly by one or several cycles with respect to the a.c. measuring voltage.

8. A method according to claim 3, wherein the a.c. measuring voltage in at least one of the two parallel lines is delayed in such a manner that a phase position of the voltage fed to the measuring amplifier is displaced exactly by one or several half cycles with respect to the a.c. measuring voltage.

9. A method according to claim 1, wherein the a.c. measuring voltage in at least one of the two parallel lines is delayed in such a manner that the phase position of the voltage fed to the measuring amplifier is displaced exactly by one or several half cycles with respect to the a.c. measuring voltage.

10. A circuit for eliminating d.c. voltage components, comprising capacitive voltage divider means having a connecting point between its high end and low end condenser means, an isolating condenser connected with one electrode to said connecting point, another electrode of said isolating condenser being operatively connected to a measuring amplifier means by way of an impedance, an analog-digital converter means in series with a digital integrator means and a digital-analog converter means being operatively connected in parallel to said impedance, said analog-digital converter means, integrator means and digital-analog converter means being clocked and controlled from a common clock generator means, a measuring voltage being operable to be subdivided into equal time sections by the analog-digital converter means and a respective voltage value of each time section being operable to be fed in digital form to the digital integrator means, the digital integrator means being operable to integrate a desired a.c. measuring voltage from the digital voltage values over one cycle, and the digital integrator means being operable to continuously feed the integrated value corresponding to the respective d.c. voltage component of the a.c. measuring voltage, in the rhythm of the time sections in digital form to the digital-analog converter means, and the latter being operable to feed a d.c. voltage component corresponding to the respective time section in analog form and in opposite phase to the d.c. voltage component of the a.c. measuring voltage to the measuring amplifier means.

11. A circuit according to claim 10, further comprising an inverter means between said digital-analog converter means and the measuring amplifier means.

12. A circuit according to claim 10, wherein said digital-analog converter means inverts the analog d.c. voltage component.

13. A circuit according to claim 10, further comprising a microprocessor means operable as clock generator and control means.

14. A circuit according to claim 13, further comprising means for feeding an a.c. measuring voltage picked up from the capacitive voltage divider means to an ohmic voltage divider means, the isolating condenser means being operatively connected to a point of connection of the ohmic voltage divider means.

15. A circuit according to claim 14, further comprising amplifier means between the ohmic voltage divider means and the isolating condenser means.

16. A circuit according to claim 10, further comprising means for feeding an a.c. measuring voltage picked up from the capacitive voltage divider means to an ohmic voltage divider means, the isolating condenser means being operatively connected to a point of connection of the ohmic voltage divider means.

17. A circuit according to claim 10, further comprising amplifier means between the voltage divider means and the isolating condenser means.

18. An apparatus for eliminating d.c. voltage components of a capacitive a.c. voltage divider means, whose a.c. measuring voltage which may include a d.c. voltage component is fed to a measurement transformer, comprising isolating condenser means, microprocessor means, analog-digital converter means, digital integrator means, digital-analog converter means and measurement transformer means, said isolating condenser means being operatively connected to a point of connection of the capacitive voltage divider means, the isolating condenser means being operatively connected with the measurement transformer by way of two parallel line means, one of said line means being operatively connected with the measurement transformer to feed any present d.c. component in one phase and the other line feeding any possibly present d.c. voltage component to said measurement transformer in opposite phase, said other line including the analog-digital means in series with the integrator means and the digital-analog converter means, and the microprocessor means being operable to control the analog-digital converter means, the digital integrator means and the digital-analog converter means by a single clock generator.

19. An apparatus according to claim 18, further comprising measuring amplifier means, said two line means being operatively connected to the input of the measuring amplifier means and an output of said measuring amplifier means being operatively connected to said measurement transformer.

* * * * *